United States Patent
Jaehne et al.

(10) Patent No.: US 7,127,225 B2
(45) Date of Patent: Oct. 24, 2006

(54) ACCUMULATOR CONTROLLED PRESCALER IN A PHASED LOCKED LOOP

(75) Inventors: Rolf Jaehne, Ottendorf-Okrilla (DE); Wolfram Kluge, Dresden (DE); Thorsten Riedel, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 495 days.

(21) Appl. No.: 10/617,485

(22) Filed: Jul. 11, 2003

(65) Prior Publication Data

US 2004/0022340 A1    Feb. 5, 2004

(30) Foreign Application Priority Data

Jul. 31, 2002    (DE)    ................................. 102 34 993

(51) Int. Cl.
    *H04B 1/06*    (2006.01)
(52) U.S. Cl. ................ 455/260; 455/165.1; 455/180.3; 375/373; 375/376
(58) Field of Classification Search ................ 455/260, 455/183.1, 180.3, 196.1, 216, 550.1, 575.1, 455/424, 425, 456.5, 456.6, 561, 42, 139, 455/147, 258, 264, 265, 165.1, 76; 375/376, 375/373, 215, 327, 354, 226, 362; 377/48.51; 331/25, 16–17, 1 R, 18, 175, 154, 117 R; 327/156, 147

See application file for complete search history.

(56) References Cited

U.S. PATENT DOCUMENTS

| | | | |
|---|---|---|---|
| 5,521,948 A * | 5/1996 | Takeuchi | .................... 375/376 |
| 5,572,168 A * | 11/1996 | Kasturia | ......................... 331/2 |
| 6,107,843 A | 8/2000 | de Gouy et al. | |
| 6,236,278 B1 * | 5/2001 | Olgaard | ....................... 331/25 |
| 6,553,089 B1 | 4/2003 | Huh et al. | |

(Continued)

FOREIGN PATENT DOCUMENTS

DE    199 46 200 A1    5/2001

(Continued)

OTHER PUBLICATIONS

Woogeun Rhee et al. "A 1.1.-GHz CMOS Fractional-N Frequency Synthesizer with a 3-b Third-Order ΔΣ Modulator", IEEE Journal of Solid-State Circuits, vol. 35, No. 10, Oct. 2000, pp. 1453-1459.

(Continued)

*Primary Examiner*—Edward F. Urban
*Assistant Examiner*—Charles Chow
(74) *Attorney, Agent, or Firm*—Meyertons Hood Kivlin Kowert & Goetzel, P.C.; B. Noël Kivlin (57) ABSTRACT

A wireless local area network transceiver, an integrated circuit chip, a PLL (Phase Locked Loop) device and a method are provided that may reduce influences of switching noise. The frequency of an output signal of the PLL device is divided in a prescaler of the PLL device by a prescaler factor. The prescaler is operable in at least two modes with each mode having assigned a different prescaler factor. An accumulator is implemented in the PLL circuit for generating a mode switching signal for changing the mode of the prescaler. The generation of the mode switching signal is done by storing an accumulator value and processing a modulus function for updating the accumulator value. The provided technique may allow for reducing disturbances caused by switching the mode of the prescaler in the PLL circuit.

26 Claims, 4 Drawing Sheets

U.S. PATENT DOCUMENTS

2001/0017572 A1* 8/2001 Harpham ..................... 331/14
2002/0025778 A1* 2/2002 Lee ........................... 455/3.05
2002/0198912 A1* 12/2002 Humphreys et al. ........ 708/270

FOREIGN PATENT DOCUMENTS

DE 101 49 593 A1 6/2002

OTHER PUBLICATIONS

T. Kim et al. "Swallow Counterless DMP PLL", 1999 IEEE VL-P23, 0-7803-5727-2/99, pp. 606-608.

* cited by examiner

# ACCUMULATOR CONTROLLED PRESCALER IN A PHASED LOCKED LOOP

BACKGROUND OF THE INVENTION

1. Field of the Invention

The invention generally relates to PLL (Phase Locked Loop) devices that may operate as frequency synthesizers in communication systems such as WLAN (Wireless Local Area Network) systems, and to WLAN receivers or transceivers and integrated circuit chips. The invention relates, in particular, to PLL devices comprising a prescaler.

2. Description of the Related Art

A wireless local area network is a flexible data communication system implemented as an extension to, or as an alternative for, a wired LAN. Using radio frequency or infrared technology, WLAN (Wireless Local Area Network) systems transmit and receive data over the air, minimizing the need for wired connections. Thus, WLAN systems combine data connectivity with user mobility.

Most WLAN systems use spread spectrum technology, a wide-band radio frequency technique developed for use in reliable and secure communication systems. The spread spectrum technology is designed to trade-off bandwidth efficiency for reliability, integrity and security.

PLL devices are widely used in the above-mentioned technologies for the purpose of frequency synthesis, clock generation, clock recovery, demodulation and others in digital, as well as, in analog based circuits. In frequency synthesis techniques, phase locked loops represent the dominant method in wireless communication systems such as WLAN systems.

Current PLL integrated circuits are able to execute all PLL functions on a single, highly integrated digital and mixed signal circuit that operates on low supply voltages and consumes very low power. These integrated circuits require only an external frequency reference, voltage control oscillators (VCO) and a few external passive components to generate the wide range of frequencies.

Figure 1:
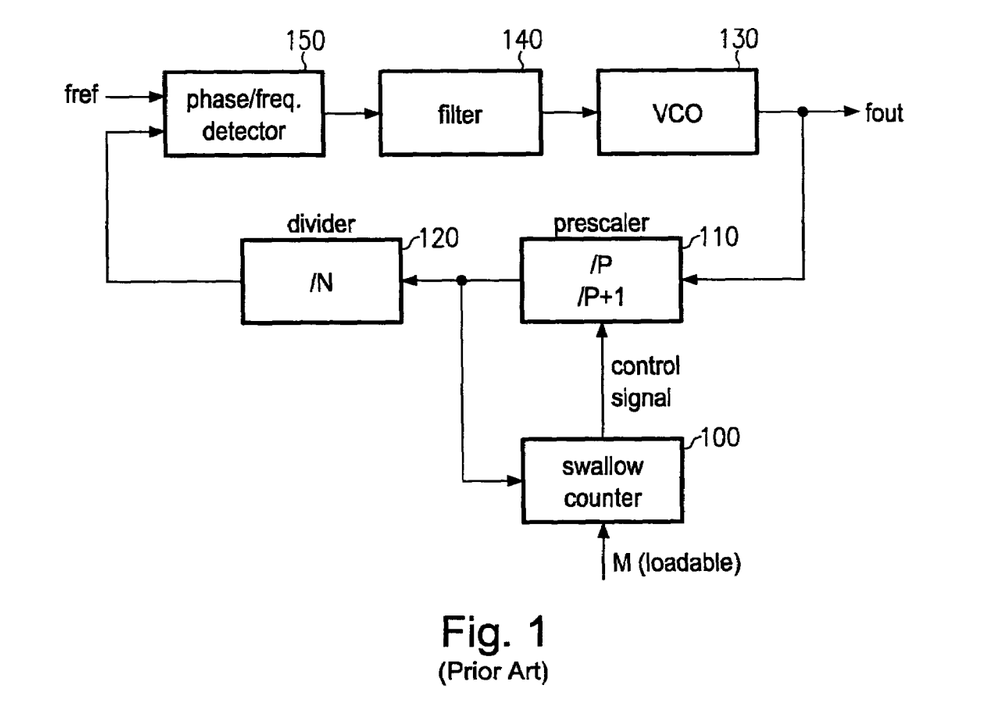
FIG. 1 is a block diagram of a well known PLL circuit and the arrows indicate the signal flow between the different units.

An example of a conventional PLL frequency synthesizer is depicted in FIG. 1. As can be seen from the figure, the PLL frequency synthesizer has a forward signal path that includes a phase or frequency detector 150, a loop filter 140, a voltage controlled oscillator 130, and a feedback path that includes a prescaler unit 110 and a divider unit 120. In addition, a swallow counter 100 is provided for controlling the prescaler 110 dependent on a loadable counter factor M. The prescaler output is connected to the swallow counter 100 for synchronizing the swallow counter with a PLL clock. The swallow counter is further connected to a prescaler mode control terminal of the prescaler to provide a mode control signal for controlling the prescaler mode. Beside the divider 120, the prescaler 110 drives the swallow counter 100.

As explained above, the conventional PLL feedback path comprises two separate units having different division factors, and a swallow counter receiving the loadable counter factor M. The prescaler 110 applies a divider factor of P or P+1 depending on the mode control signal delivered by the swallow counter 100. The divider unit 120 applies a fixed divider factor N. The overall divider factor can then be expressed as:

$$X=P \cdot (N-M)+(P+1) \cdot M$$

Conventional PLL systems have numerous disadvantages because interference and signal-to-noise ratio are important points to be considered in system design. Phase noise and spurious emissions contribute significantly to signal interference and signal-to-noise ratio and are largely dependent on the performance of the PLL devices.

Figure 2:
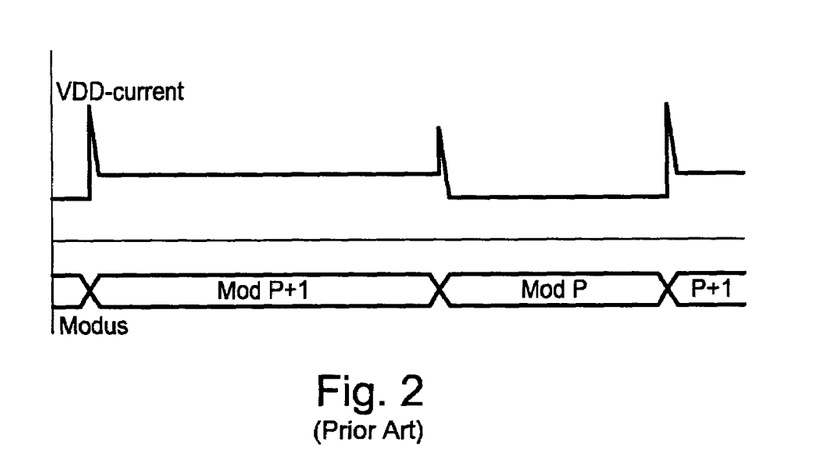
FIG. 2 is a time chart illustrating the switching of the prescaler mode in the PLL circuit of FIG. 1 and switching effected peaks in the current plotted over time.

Phase noise and spurious emissions may appear by toggling the mode of the prescaler 110 in the conventional PLL circuit of FIG. 1. The time chart of FIG. 2 illustrates the toggling of the prescaler mode that is under control of the swallow counter 100. Further, the current consumption behavior of the prescaler 110 is illustrated in correspondence to the depicted mode toggling of the prescaler mode. It can be seen that each toggling of the prescaler 110 effects a high current peak. Those high current peaks may lead to the above-mentioned phase noise and spurious emissions, and the phase noise and spurious emissions are highly disadvantageous.

Thus, minimizing phase noise and spurious emissions of the device is one of the problems of present technologies which is intensely addressed.

An example of a synthesizer where the influences of disturbances are minimized is published in W. Rhee et al. "A 1.1-GHz CMOS Fractional-N Frequency Synthesizer with a 3-b Third-Order $\Delta\Sigma$ Modulator", IEEE J. Solid-State Circuits, vol. 35, no 10, October 2000, pp. 1453–1459. However, this approach requires a number of interconnected subunits which are difficult to implement so that the resulting frequency synthesizer is complicated in construction.

An arrangement avoiding the use of a swallow counter is published in T. Kim et al. "Swallow Counterless DMP PLL", IEEE, VL-P23, 1999, 0-7803-5727-2/99, pp. 606–608. In this technique, the swallow counter is replaced by a JK-flip flop for reducing power consumption and gate counts. However, the described technique may still suffer from the disturbances mentioned above, including those which are related with phase noise and spurious emissions.

SUMMARY OF THE INVENTION

An improved PLL technique is disclosed that may allow for frequency stabilization to improve the accuracy and the stability by reducing the influence of spurious signals.

In one embodiment, there is provided a phase locked loop device that comprises a prescaler for dividing the frequency of an output signal of the phase locked loop device by a prescaler factor. The prescaler is operable in at least two modes, wherein each mode has assigned a different prescaler factor. The phase locked loop device further comprises an accumulator, that is connected to the prescaler for providing a mode switching signal to the prescaler. The accumulator stores an accumulator value. The accumulator is adapted for repetitively updating the accumulator value using a modulus function to generate the mode switching signal.

In another embodiment, there is provided an integrated circuit chip having a phase locked loop circuit that comprises a prescaler circuit for dividing the frequency of an output signal of the phase locked loop circuit by a prescaler factor. The prescaler circuit is operable in at least two modes, wherein each mode has assigned a different prescaler factor. The phase locked loop circuit further comprises an accumulator circuit, that is connected to the prescaler circuit for providing a mode switching signal to the prescaler circuit. The accumulator circuit stores an accumulator value. The accumulator circuit is adapted for repetitively updating the accumulator value using a modulus function to generate the mode switching signal.

In a further embodiment, there is provided a transceiver in a WLAN communication system. The transceiver has a phase locked loop device that comprises a prescaler for dividing the frequency of an output signal of the phase locked loop device by a prescaler factor. The prescaler is operable in at least two modes, wherein each mode has assigned a different prescaler factor. The phase locked loop device further comprises an accumulator, that is connected to the prescaler for providing a mode switching signal to the prescaler. The accumulator stores an accumulator value. The accumulator is adapted for repetitively updating the accumulator value using a modulus function to generate the mode switching signal.

In an additional embodiment, there is provided a method of operating a phase locked loop device. The method comprises dividing the frequency of an output signal of the phase locked loop device in a prescaler of the phase locked loop device by a prescaler factor. The prescaler is operable in at least two modes, wherein each mode has assigned a different prescaler factor. The method further comprises generating a mode switching signal for changing the mode of the prescaler. The generation of the mode switching signal comprises storing an accumulator value, and processing a modulus function for updating the accumulator value.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following, and more particular description of the invention as illustrated in the accompanying drawings, wherein.

DETAILED DESCRIPTION OF THE INVENTION

The illustrative embodiments of the present invention will be described with reference to the figure drawings, wherein like elements and structures are indicated with like reference numbers.

Figure 3:
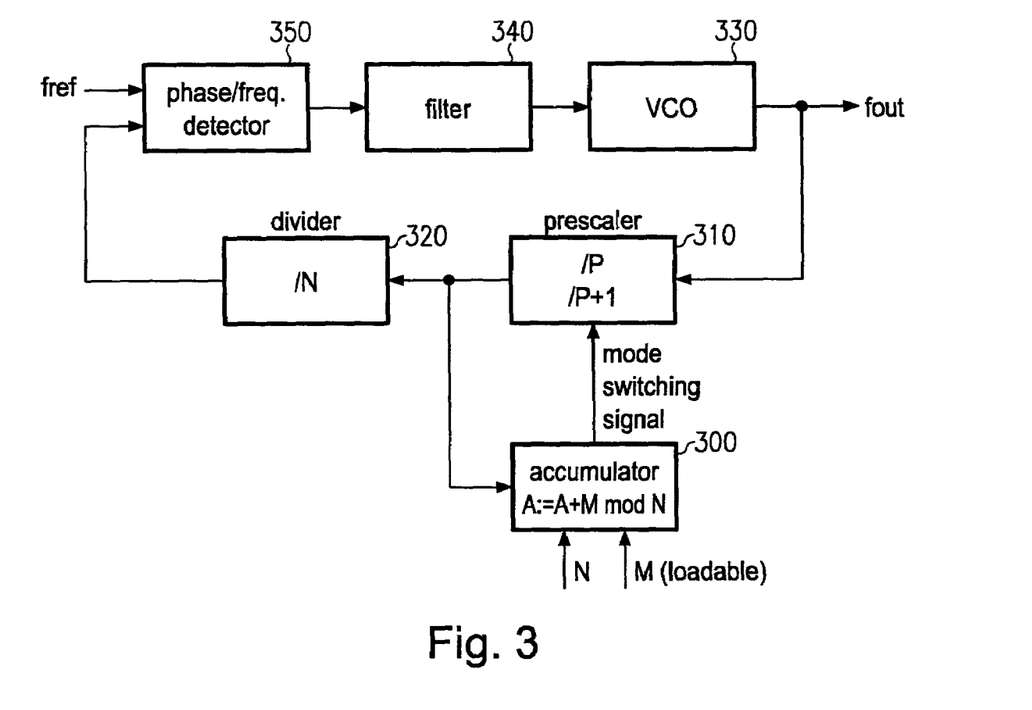
FIG. 3 is a block diagram of a PLL circuit according to an embodiment and the arrows indicate the signal flow between the different units.

Referring now to the drawings, in particular to FIG. 3, which illustrates one embodiment of a PLL circuit, the circuit differs from the conventional PLL circuit shown in FIG. 1 in that the swallow counter 100 of FIG. 1 is substituted by an accumulator 300. As illustrated in FIG. 3, the accumulator 300 is connected to the feedback path of the PLL circuit at a point between a divider unit 320 and a prescaler unit 310 for receiving an output signal of the prescaler unit 310. The accumulator 300 is further connected to a prescaler mode terminal of the prescaler 310 for delivering a mode switching signal.

The prescaler 310 is adapted for dividing the frequency fout of an output signal of the phase locked loop device by a prescaler factor. The prescaler 310 may operate in at least two modes, where each mode has assigned a different prescaler factor, e.g. P and P+1.

As explained above, the accumulator 300 is implemented in the PLL circuit for providing the mode switching signal to the prescaler 310 for changing the prescaler mode. Fundamental for providing the mode switching signal, is the fact, that the accumulator 300 processes an accumulator value A by performing a modulus function.

Processing the accumulator value A by performing the modulus function is in the present embodiment defined by the equation:

$$A:=(A+M) \bmod N$$

Core of the equation is the modulus function that may in general be written as follows:

$$\text{result} = \text{operand1} \bmod \text{operand2}.$$

The modulo arithmetic operator, also called the remainder operator, divides operand1 by operand2 and returns the remainder of the division as result. For example: 17 mod 7=3 because the result of the division 17/7 is 2.428, i.e. 2 with a remainder of 3.

In the above accumulator equation it can be seen, that operand1 is represented by the sum of accumulator value A and the tune parameter M and operand2 is represented by the modulus parameter N.

Assuming an initial accumulator value A of zero, and further taking an example of M being 8 and N being 13, the accumulator value A will be changed at each clock to result in the following sequence of accumulator values:

$$0 \to 8 \overset{*}{\to} 3 \to 11 \overset{*}{\to} 6 \overset{*}{\to} 1 \to 9 \overset{*}{\to} 4 \to 12 \overset{*}{\to} \ldots$$

As can be seen therefrom, while the sequence follows certain rules, the individual accumulator value has a somehow irregular appearance and each possible value occurs in the sequence with the same probability.

In the above sequence, each accumulator value update step, where the integer division result of A+M divided by N is greater then zero, is marked by an asterisk. In the present embodiment, the mode switching signal is generated to control the prescaler 310 to toggle its mode each time when the integer division result is non-zero. That is, the mode is toggled rather frequently in the above example sequence, each time when the accumulator value update process is marked by an asterisk.

To explain the mode toggle mechanism according to the embodiment in more detail, the function as shown in the above equation can be disassembled into the following calculation steps:

$$A:=A+M;$$

$$\text{If } A>N \text{ then } A:=A-N;$$

In this example, the mode will be toggled each time the accumulator value is decreased by the modulus parameter N. This may be done e.g. by setting a carry flag when determining that the intermediate accumulator value A exceeds the modulus parameter N, and generating the mode switching signal according to the carry flag.

A further explanation of processing the accumulator value A will follow later, wherein the process is split in operation steps.

Figure 4:
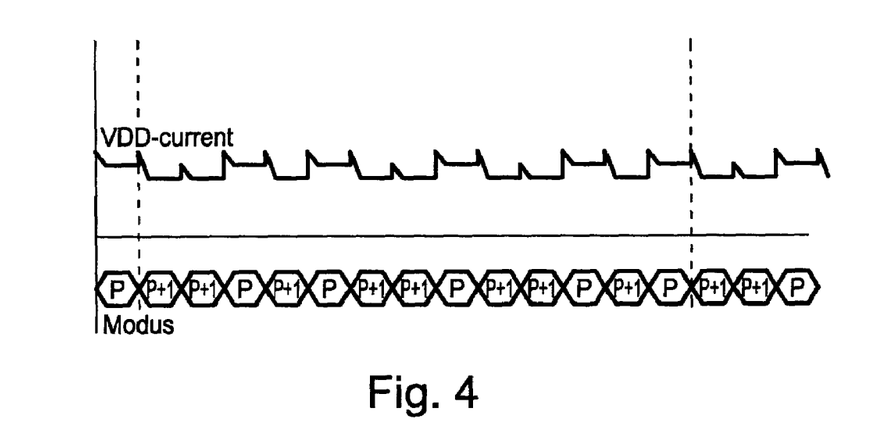
FIG. 4 is a time chart similar to that of FIG. 2 but for illustrating the switching of the prescaler mode of the PLL circuit of FIG. 3.

Turning now to FIG. 4, a toggling of the prescaler mode is depicted under control of the accumulator 300. Further, the current consumption behavior of the prescaler 310 is illustrated in correspondence to the depicted mode toggling of the prescaler mode.

Comparing FIG. 4 with FIG. 2, it can be seen that the prescaler mode controlled by the accumulator 300 is more frequently toggled than the prescaler mode controlled by the swallow counter 100 shown in FIG. 2. This more frequent toggling of the prescaler mode controlled by the accumulator 300 effects a significant reduction of the peak heights.

Figure 5:
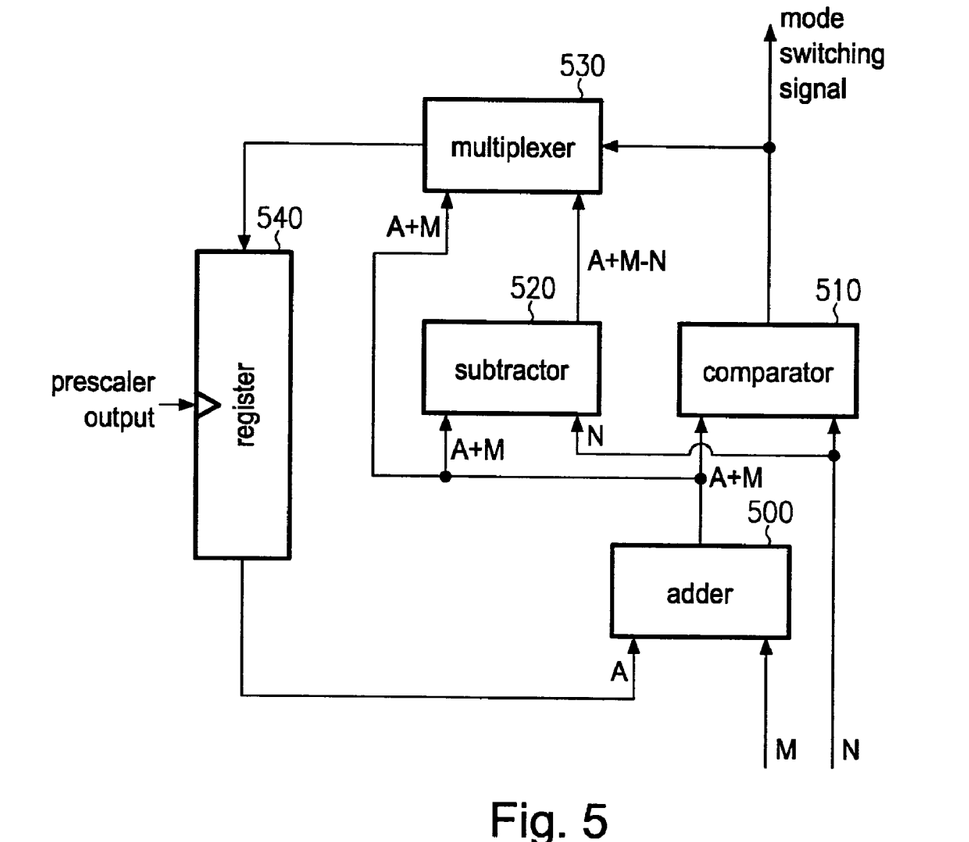
FIG. 5 is a detailed block diagram of an accumulator shown in FIG. 3 according to another embodiment.

Referring to FIG. 5, the units of the accumulator 300 of FIG. 3 are depicted more detailed. The depicted units operate together for generating the mode switching signal for toggling the prescaler mode by using a modulus function.

The accumulator 300 comprises an adder unit 500, a comparator unit 510, a subtractor unit 520, a multiplexer 530 and a register 540. The register 540 is used for storing and updating the accumulator value A.

The accumulator 300 further comprises input terminals and one output terminal. The output terminal is connected to the prescaler 310 to deliver the mode switching signal for toggling the prescaler mode.

One of the above-mentioned input terminals is for receiving a modulus parameter N for use in the comparator unit 510 and another input terminal receives a tune parameter M for use in the adder unit 500. An additional input terminal is connected to the prescaler output in the feedback path of the PLL circuit to deliver the prescaler output signal to the register 540.

As mentioned-above, the adder unit 500 receives the tune parameter M by an input terminal. Further, the adder unit 500 is connected to the register 540 to receive the accumulator value A. The adder unit 500 calculates the sum of the accumulator value A and the tune parameter M. The resulting sum A+M is delivered to input terminals of the multiplexer 530, the subtractor unit 520 and the comparator 510.

A comparator output is connected for delivering the mode switching signal to the prescaler 310 and to the multiplexer 530, simultaneously.

The subtractor unit 520 calculates the difference of the sum of the accumulator value A and the tune parameter M, and the modulus parameter N. The subtraction result A+M−N is delivered to the multiplexer 530.

The multiplexer 530 is connected to receive the adder result, the subtractor result and the comparator result for switching one of the adder and subtractor results to the register 540 for updating the accumulator value A.

Figure 6:
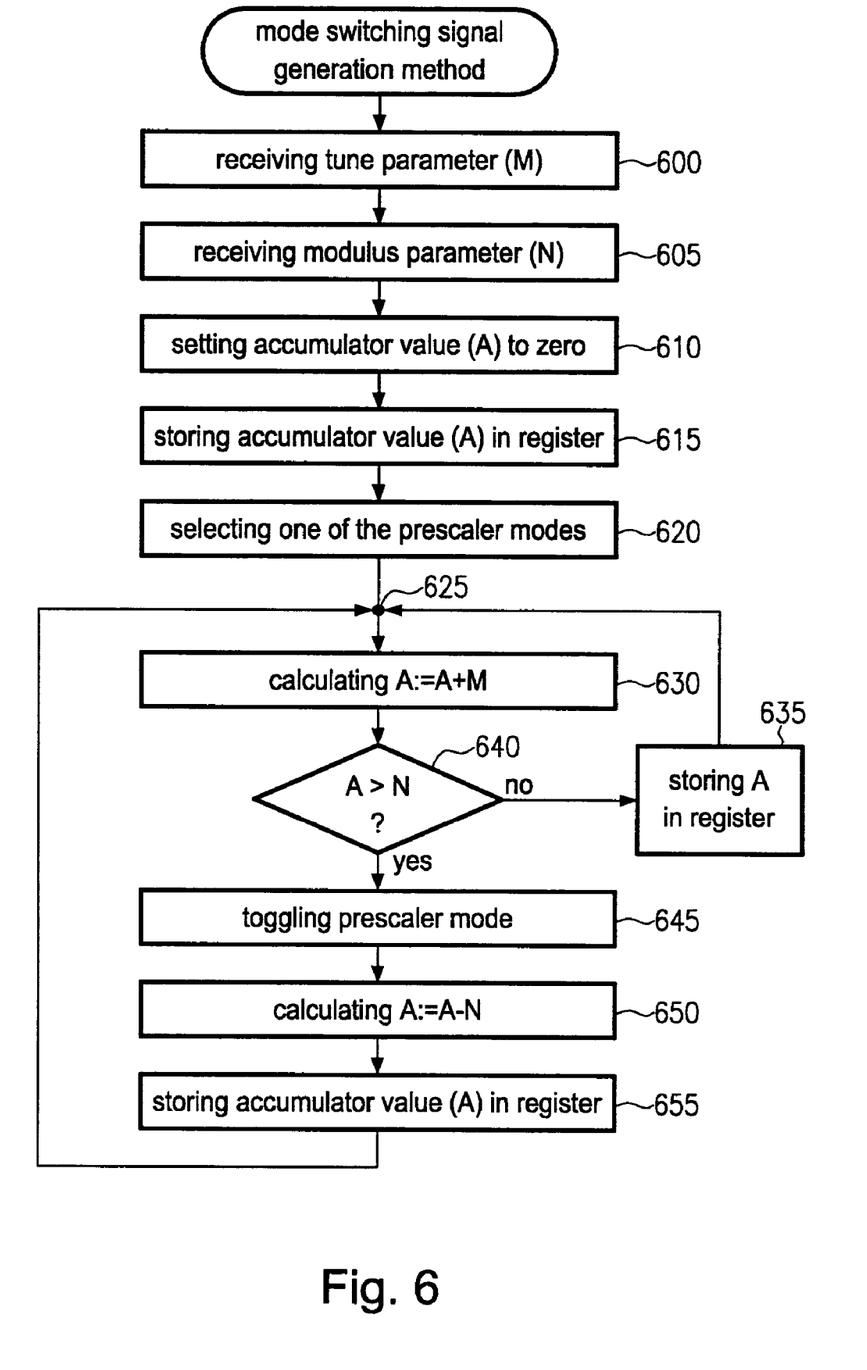
FIG. 6 is a flow chart illustrating a method of operating the accumulator of FIG. 3.

Turning now to the flowchart of FIG. 6, the steps from 600 to 620 are provided to set up the accumulator 300 in its start constellation. Setting the accumulator 300 in its start constellation comprises receiving the tune parameter M in step 600 and the modulus parameter N in step 605, setting 610 the accumulator value A to zero, storing 615 this zero accumulator value A into the register 540 and selecting 620 one of the prescaler modes.

As mentioned above, the steps from 600 to 620 initialize the accumulator 300. The subsequent steps will then generate the mode switching signal by the accumulator 300 using the modulus function.

In step 630, the sum of the accumulator value A and the tune parameter M is calculated, and the accumulator value is updated to be the resulting sum. After performing the calculation, the accumulator value A will be compared with the modulus parameter N in step 640.

If the accumulator value A is equal to or smaller than the modulus parameter N, the accumulator value A will be stored in the register 540 in the step 635, and the process returns to the position 625 to restart the calculation step 630 in the next clock cycle.

If however the accumulator value A is greater than the modulus parameter N, the prescaler mode will be toggled in step 645. The subsequent step 650 is a further calculation step, wherein the modulus parameter N is subtracted from the accumulator value A, and the accumulator value A is updated to A−N.

The updated accumulator value A will be stored into the register 540 in step 655. After storing the updated accumulator value A, the process steps back to position 625 and performs the operation steps 630 to 655 respectively in a loop depending on the comparison step 640.

The above discussed embodiments in FIG. 5 and FIG. 6 describe a possible example of the accumulator 300. In an additional embodiment the accumulator 300 may be further improved by splitting the accumulator 300 in a plurality of smaller accumulator units, wherein each of the smaller accumulator units have a reduced bit width.

The accumulator 300 of this embodiment comprises a register block and a combinatorial logic that is adapted to realize a fixed modulo factor.

Generally, the maximum processing frequency of an accumulator may be defined by its internal carry bit transfer time from one bit stage to the next.

Therefore, a combination of bit width reduced accumulator units allow an increased maximum processing frequency.

For example, assuming a nine bit wide control word may be processed in three accumulator units, wherein each of the three accumulator units have the ability to process three bits. This partitioning of the nine bit wide control word is possible because the architecture of the embodiments offer an asynchronous operation and therefore no synchronization between the accumulator 300 and the divider 320 is required.

An example of the above mentioned processing of a nine bit wide control word will be discussed in the following in more detail.

The first of the three accumulator units processes the current value of the nine bit wide control word during a first clock cycle and generates a first carry signal. This first carry signal is taken over in the second clock cycle by the next accumulator unit, and the current value will further be processed by calculating a sum and generating a second carry signal. The second carry signal is taken over by the third accumulator unit in the third clock cycle, and during the third clock cycle the current value is processed, and the third accumulator unit also generates a carry signal. This signal represents the control signal for the prescaler 310. After the above described process, the third accumulator unit holds a value that represents a divider factor of N, the second accumulator unit holds a value that represents a divider factor of N+1, and the first accumulator unit holds a value that represents a divider factor of N+2.

Each of the bit width reduced accumulator units is adapted to operate as a modulus accumulator, and the overall modulus factor is the product of the modulus factors of the three bit wide accumulator units. The modulus factors are integer values.

The above described technique offers the advantage that the modulus parameter N can be implemented in a hard coded manner so that no selection of the modulus parameter is necessary. A further advantage is therefore the fact, that the input of the modulus parameter N shown FIGS. 3 and 5 may in the present embodiment no longer be required.

Another advantage to be highlighted is that no synchronization of the divider 320 and the accumulator 300 is required, and therefore the use of synchronization signals that contain high peak currents is avoided.

It is possible to adapt the above mentioned combinatorial logic of the accumulator 300 for different modulus parameters. In this case the divider uses the modulus parameter as a divider factor and therefore the divider factor of the divider may be switchable.

It is to be noted that no synchronization is required between the accumulator 300 and the divider 320.

As apparent from the foregoing description, all of the embodiments as described may advantageously provide a high-precision, high-accuracy and high-density technique that may be used in a wireless local area network receiver, in a frequency synthesizer or in an integrated circuit chip to achieve high stability in controlling high frequencies.

The arrangements may further have the advantage to reduce the PLL circuit sensibility for disturbances.

Furthermore, the arrangements may achieve the additional advantage of enabling very fast toggling due to the fact that an accumulator uses a modulus function for generating a mode switching signal to be supplied to a prescaler. The very fast toggling of the prescaler mode may result in highly reduced current peaks that occurs in toggling the prescaler mode.

Moreover, the arrangements may have the advantage to reduce high frequency switching noise, in particular at noise frequencies in the range of the reference frequency at the input of the PLL circuit.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order not to unnecessarily obscure the invention described herein. Accordingly, it is to be understood that the invention is not to be limited by the specific illustrative embodiments, but only by the scope of the appended claims.

What is claimed is:

1. A phase locked loop device comprising:
    a prescaler configured to divide the frequency of an output signal of the phase locked loop device by a prescaler factor, said prescaler being operable in at least two modes, each mode having assigned a different prescaler factor; and
    an accumulator connected to said prescaler configured to provide a mode switching signal to said prescaler to switch between said at least two modes having assigned different prescaler factors, said accumulator storing an accumulator value,
    wherein said accumulator is adapted to repetitively update said accumulator value using a modulus function, to generate said mode switching signal to switch between said at least two modes having assigned different prescaler factors.

2. The phase locked loop device of claim 1, wherein said accumulator is connected to receive a tune parameter selected for tuning the frequency of said output signal, wherein said accumulator is adapted to take into account said tune parameter when processing the modulus function for generating said mode switching signal.

3. The phase locked loop device of claim 1, further comprising:
    a divider unit connected to said prescaler for dividing the frequency of the prescaler output by a fixed divider factor, wherein said accumulator is adapted for processing said modulus function dependent on a received modulus parameter, and said fixed divider factor is equal to said modulus parameter.

4. The phase locked loop device of claim 1, wherein said accumulator is adapted for taking into account a modulus parameter and receiving a tune parameter, the modulus parameter being a fixed divider factor of a divider unit of the phase locked loop device, the tune parameter being selected for tuning the frequency of said output signal, wherein said accumulator is adapted to take into account said modulus parameter and said tune parameter when processing the modulus function for generating said mode switching signal.

5. The phase locked loop device of claim 4, wherein said accumulator is adapted to calculate the sum of the accumulator value and the tune parameter and to calculate the accumulator value to be the result of applying said modulus function to said sum and said modulus parameter.

6. The phase locked loop device of claim 4, wherein said modulus parameter is hard coded in said accumulator.

7. The phase locked loop device of claim 1, wherein said accumulator comprises a plurality of subunits having reduced bit widths.

8. The phase locked loop device of claim 7, wherein the bit width of each subunit of said accumulator is three bits.

9. The phase locked loop device of claim 1, further comprising:
    an input terminal for receiving a reference signal having a frequency to be compared with a frequency of a phase locked loop feedback signal for adjusting the frequency of said output signal.

10. The phase locked loop device of claim 9, wherein said accumulator is adapted for changing said mode switching signal at least three times in each period of said reference signal.

11. The phase locked loop device of claim 1, adapted for being operated in a transceiver of a WLAN (Wireless Local Area Network) communication system.

12. The phase locked loop device of claim 1, adapted for being operated as a frequency synthesizer.

13. An integrated circuit chip having a phase locked loop circuit, comprising:
    a prescaler circuit configured to divide the frequency of an output signal of the phase locked loop circuit by a prescaler factor, said prescaler circuit being operable in at least two modes, each mode having assigned a different prescaler factor; and
    an accumulator circuit connected to said prescaler circuit configured to provide a mode switching signal to said prescaler circuit to switch between said at least two modes having assigned different prescaler factors, said accumulator circuit storing an accumulator value,
    wherein said accumulator circuit is adapted to repetitively update said accumulator value using a modulus function, to generate said mode switching signal to switch between said at least two modes having assigned different prescaler factors.

14. A transceiver in a WLAN (Wireless Local Area Network) communication system, the transceiver having a phase locked loop device comprising:
    a prescaler configured to divide the frequency of an output signal of the phase locked loop device by a prescaler factor, said prescaler being operable in at least two modes, each mode having assigned a different prescaler factor; and an accumulator connected to said prescaler configured to provide a mode switching signal to said prescaler to switch between said at least two modes having assigned different prescaler factors, said accumulator storing an accumulator value, wherein said accumulator is adapted to repetitively update said accumulator value using a modulus function, to generate said mode switching signal to switch between said at least two modes having assigned different prescaler factors.

15. A method of operating a phase locked loop device, the method comprising:

dividing the frequency of an output signal of the phase locked loop device in a prescaler of said phase locked loop device by a prescaler factor, said prescaler being operable in at least two modes, each mode having assigned a different prescaler factor; and generating a mode switching signal for changing the mode of said prescaler to another mode of said at least two modes having assigned different prescaler factors, wherein generating the mode switching signal comprises:

storing an accumulator value; and processing a modulus function for updating said accumulator value.

16. The method of claim 15, wherein the step of processing said modulus function comprises:

receiving a tune parameter for tuning the frequency of said output signal.

17. The method of claim 15, wherein the step of dividing the frequency of said output signal comprises:

dividing the frequency of a prescaler output by a fixed divider factor;

wherein processing said modulus function depends on a received modulus parameter, wherein said fixed divider factor is equal to said modulus parameter.

18. The method of claim 15, wherein the step of processing said modulus function comprises:

receiving a modulus parameter and a tune parameter, said modulus parameter being a fixed divider factor and said tune parameter being selected for tuning the frequency of said output signal, and taking into account said modulus parameter and said tune parameter when updating said accumulator value.

19. The method of claim 18, wherein the step of processing said modulus function further comprises:

calculating a sum of said accumulator value and said tune parameter, and calculating said updated accumulator value to be the result of applying said modulus function to said sum and said modulus parameter.

20. The method of claim 19, wherein the step of calculating further comprises:

storing said sum as the updated accumulator value in a register.

21. The method of claim 19, wherein the step of calculating said sum comprises:

subtracting said modulus parameter from said sum, and storing the difference as the updated accumulator value in a register.

22. The method of claim 21, wherein further comprising:

comparing said sum with said modulus parameter, wherein calculating the updated accumulator value comprises:

changing the mode switching signal such that said prescaler changes its mode depending on the comparing result.

23. The method of claim 15, further comprising:

receiving a reference signal having a frequency to be compared with a frequency of a phase locked loop feedback signal, and adjusting the frequency of said output signal.

24. The method of claim 23, wherein the step of adjusting comprises:

changing said mode switching signal at least three times in each period of said reference signal.

25. The method of claim 15, adapted for operating said phase locked loop device in a transceiver of a WLAN (Wireless Local Area Network) communication system.

26. The method of claim 15, further adapted for operating said phase locked loop device as a frequency synthesizer.

* * * * *